United States Patent
Sisodia et al.

(10) Patent No.: US 11,100,965 B1
(45) Date of Patent: Aug. 24, 2021

(54) BITLINE PRECHARGING TECHNIQUES

(71) Applicant: Arm Limited, Cambridge (GB)

(72) Inventors: Rajiv Kumar Sisodia, Bangalore (IN); Disha Singh, Bangalore (IN); Yattapu Viswanatha Reddy, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/821,945

(22) Filed: Mar. 17, 2020

(51) Int. Cl.
  *G11C 7/12* (2006.01)
  *G11C 8/18* (2006.01)
  *G11C 7/22* (2006.01)
  *G11C 8/08* (2006.01)

(52) U.S. Cl.
  CPC ........... *G11C 7/12* (2013.01); *G11C 7/222* (2013.01); *G11C 8/08* (2013.01); *G11C 8/18* (2013.01)

(58) Field of Classification Search
  CPC ..................................................... G11C 7/12
  USPC .................................................... 365/203
  See application file for complete search history.

(56) References Cited

U.S. PATENT DOCUMENTS

| 10,134,469 | B1* | 11/2018 | Liu ................. G11C 13/0033 |
| 2002/0064075 | A1* | 5/2002 | Morishima ......... G11C 11/419 365/203 |
| 2007/0165441 | A1* | 7/2007 | Kurjanowicz ........ G11C 17/16 365/96 |
| 2012/0182782 | A1* | 7/2012 | Kurjanowicz .... H01L 21/28211 365/94 |

* cited by examiner

*Primary Examiner* — Muna A Techane
(74) *Attorney, Agent, or Firm* — Pramudji Law Group PLLC; Ari Pramudji (57) ABSTRACT

Various implementations described herein are related to a device having an array of bitcells that are accessible via wordlines and bitlines including unselected bitlines and a selected bitline. Each bitcell in the array of bitcells may be selectable via a selected wordline of the wordlines and the selected bitline of the bitlines. The device may include precharge circuitry that is configured to selectively precharge the unselected bitlines and the selected bitline before arrival of a wordline signal on the selected wordline.

20 Claims, 8 Drawing Sheets

IO Signals for Mux_2 Truth Table 402

| Column Selected | Prechrage Signal Status | |
|---|---|---|
| COL_SEL<0> | PRECH<0> = OFF | PRECH<1> = ON |
| COL_SEL<1> | PRECH<0> = ON | PRECH<1> = OFF |

510 — provide an array of bitcells accessible via wordlines and bitlines, wherein each bitcell in the array of bitcells is selectable via a selected wordline of the wordlines and a selected bitline of the bitlines, and wherein the bitlines include unselected bitlines 520 — selectively precharge the selected bitline with a first precharge signal before arrival of a wordline signal on the selected wordline 530 — selectively precharge the unselected bitlines with a second precharge signal before arrival of the wordline signal on the selected wordline

BITLINE PRECHARGING TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional computing architecture, some two-port memory designs utilize 1-Read and 1-Write (1R1W) that may be implemented with 8-transistor (8T) bitcells, e.g., in RF2 designs or with 6-transistor (6T) bitcells, e.g., in pseudo 2P designs. The RF2 (8T) designs typically offer faster performance with substantially poor density, while the pseudo 2P design typically offers high-density at a cost of lower frequency. Also, in some cases, the RF2 designs may allow for read and write operations to occur at the same time, while the pseudo 2P designs (RA2P) may utilize sequential cycles (e.g., an internal read cycle followed by a write cycle) for operation. For the RA2P designs, separation time may be maintained between two GTP clock pulses (i.e., 2 global timing pulses) to meet internal setup and some critical margins. Therefore, the final cycle time is "read+separation+write" time which impacts performance, and unfortunately, for aggressive timing requirements in networking architecture, negative impacts on performance is a limiting factor. As such, there exists a need to improve internal setup timing in memory designs.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to bitline precharging schemes and techniques. For instance, the various schemes and techniques described herein may provide for an ultra-fast high-density multi-port memory design with 1-Read and 1-Write (1R1W), such as, e.g., a 2-port (1R1 W) memory design.

To overcome deficiencies of conventional memory designs, various schemes and techniques described herein are configured to improve timing by exploiting separation time effectively and using write control signals that do not need to be mixed with the clock again. The various schemes and techniques described herein operate to ensure that the write data is setup on bitlines prior to the write-word-line arrival to thereby make the write much faster than single port design, which may be limited by bitline pull-down slope. The various schemes and techniques described herein utilize novel modifications that allow for same cells to be used for single port and pseudo-dual (1R/1W) memory designs.

In some implementations, various schemes and techniques described herein provide for bitline precharging circuitry that improves write time by allowing the write bitline to pulldown while the other bitlines are being precharged. The bitline precharging circuitry described herein does not need to wait for a second GTP clock signal to arrive, and also, the bitline precharging circuitry described herein uses the portB column-address/GWEN directly to generate the write select signals (YW and WCLK signals) just after the first GTP clock resets. Also, as described herein, the wordline does not change, and the wordline will come after the second GTP clock. Some modifications refer to the GTP clock being used for YW/WCLK generation in single-port designs, while the global write enable signal (GWEN) will be used for the pseudo 2-port (RA2P) design. In some instances, even when there may be some race margins between column-address (CA) signals when generating the YW signal, it does not impact functionality because the wordline is kept OFF. Further, during the "separation time" between GTP clock pulses, with precharging of unselected bitlines and discharging of selected bitlines in parallel, the bitline may be pulled-low before the write wordline signal arrives, which provides for significant gain in performance.

Various implementations of bitline precharging schemes and techniques will be described in detail herein with reference to FIGS. 1-7C.

Figure 1:
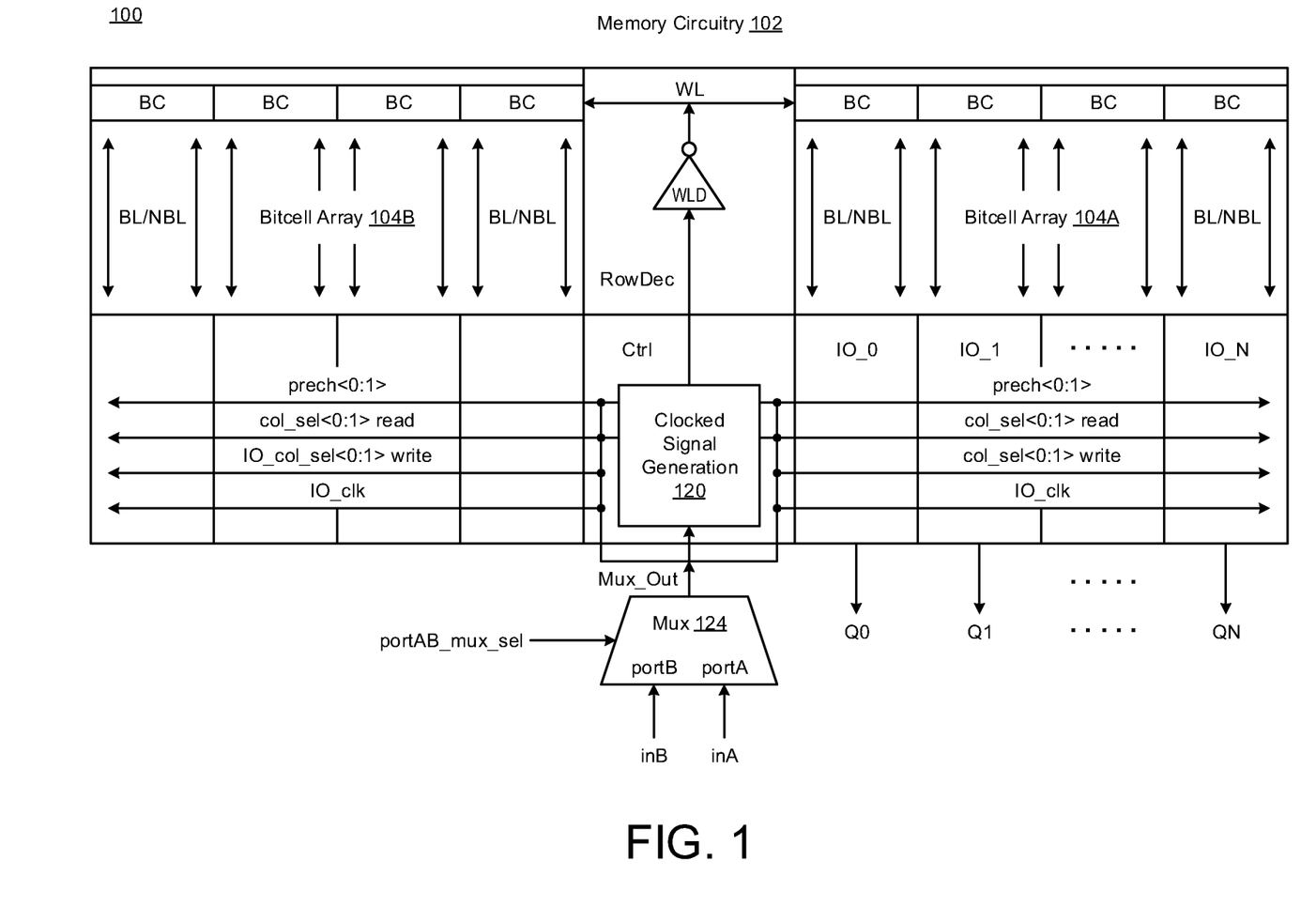
FIG. 1 illustrates a diagram of memory circuitry in accordance with various implementations described herein.

FIG. 1 illustrates a schematic diagram of memory circuitry 100 in accordance with various implementations described herein.

In various implementations, the memory circuitry 100 may be implemented as a system or a device having various integrated circuit (IC) components that are arranged and coupled together as an assemblage or combination of parts that provide for a physical circuit design and related structures. In some instances, a method of designing, providing and building the memory circuitry 100 as an integrated system or device may involve use of various IC circuit components described herein so as to thereby implement the various bitline precharging schemes and techniques associated therewith. The memory circuitry 100 may be integrated with computing circuitry and related components on a single chip, and the memory circuitry 100 may be implemented in embedded systems for electronic, mobile and Internet-of-things (IoT) applications, including sensor nodes.

As shown in FIG. 1, the memory circuitry 100 may include one or more bitcell arrays 104A, 104B of bitcells (BC) that are accessible via one or more wordlines (WL) and bitlines (BL/NBL) including unselected bitlines and a selected bitline. In some instances, each bitcell (BC) in the bitcell arrays 104A, 104B are selectable via a selected wordline of the wordlines (WL) and a selected bitline of the bitlines (BL/NBL). Also, each bitcell (BC) in the bitcell arrays 104A, 104B may be arranged in columns and rows, and the columns may include a selected column having the selected bitline, and the columns may include unselected columns having the unselected bitlines.

The memory circuitry 100 may include a number (N) of columns of input-output (IO) circuitry (IO_0, IO_1, . . . , IO_N) coupled to the columns of bitcells (BC) in the bitcell arrays 104A, 104B. In some instances, each IO circuit block (IO_0, IO_1, . . . , IO_N) may include precharge circuitry that is configured to selectively precharge unselected bitlines and selected bitline before arrival of a wordline signal on a selected wordline (WL). The precharge circuitry may be configured to selectively precharge the unselected bitlines and the selected bitline at different times during the same clock cycle before arrival of the wordline signal on the selected wordline (WL). In some instances, each IO circuit block (IO_0, IO_1, . . . , IO_N) may be configured to provide a corresponding output data signal (Q0, Q1, . . . , QN) as output from each column in the bitcell arrays 104A, 104B.

In some implementations, the selected bitline may correspond to a write bitline (WBL) that is discharged while the unselected bitlines are precharged by the precharge circuitry. In some instances, discharging a selected bitline while precharging unselected bitlines may improve write time by increasing speed of write operations to a selected bitcell in the bitcell arrays 104A, 104B. Also, in some instances, discharging the selected bitline and precharging unselected bitlines may be achieved in parallel during the same clock cycle. Further, the precharge circuitry may be configured to precharge the selected bitline with a first precharge signal, and the precharge circuitry may be configured to precharge the unselected bitlines with a second precharge signal that is different than the first precharge signal. The precharge circuitry along with various aspects and features related thereto will be described in greater detail herein.

In some implementations, the memory circuitry 102 may include a multi-input multiplexer (Mux) 124 having a first input port (portA) for receiving a first input data signal (inA) and a second input port (portB) for receiving a second input data signal (inB). The Mux 124 may be configured as a multiplexer with a portB input latch. The Mux 124 may be configured to provide an output signal (Mux_Out) based on a multiplexer select signal (portAB_mux_sel), wherein the output signal (Mux_Out) is either the portA signal or the portB signal based on the portAB_mux_sel signal. In some instances, the output signal (Mux_Out) is provided to clocked signal generation circuitry 120 (which may be part of a control logic block (Ctrl), the clocked signal generation circuitry 120 provides a data signal to the wordline driver (WLD) in a row decoder block (rowdec). The wordline driver (WLD) receives the data signal from the clocked signal generation circuitry 120 and provides a wordline signal to one or more rows of bitcells (BC) in the bitcell arrays 104A, 104B. Also, in some instances, the Mux 124 may provide the output signal (Mux_Out) to one or more IO circuit blocks (IO_0, IO_1, . . . , IO_N), wherein the output signal (Mux_Out) may be used as one or more of a precharge signal (prech<0:1>), a read column select signal (col_sel<0:1> read), a write column select signal (col_sel<0:1> write), an IO write column select signal (IO_col_sel<0:1> write), and an IO clock signal (IO_clk).

In some implementations, as described herein, the bitline precharging circuitry may be configured to selectively precharge unselected bitlines and the selected bitline to achieve improved performance and functionality such that the unselected bitlines as well as the selected bitline (which is not supposed to discharge) are precharged before arrival of the wordline (WL). Various aspects and features associated with the bitline precharging circuitry along with techniques related thereto is described in greater detail herein.

Figure 2:
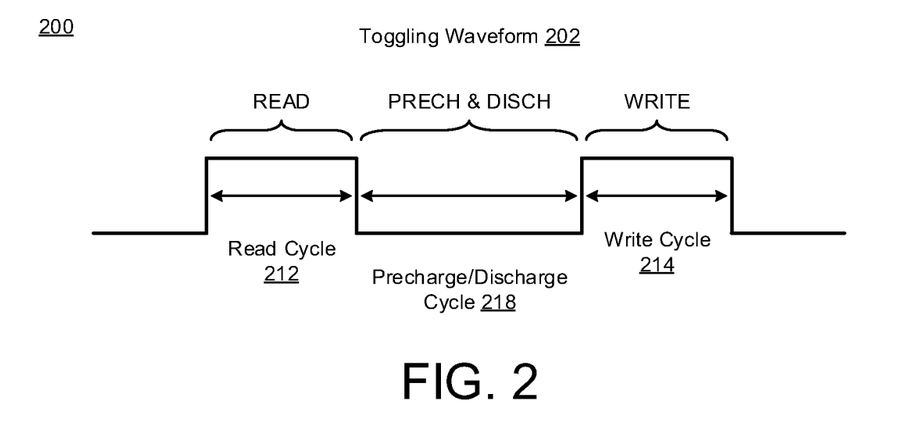
FIG. 2 illustrates a diagram of a toggling waveform in accordance with various implementations described herein.

FIG. 2 illustrates a timing diagram 200 of a toggling waveform 200 related to precharge circuitry in accordance with various implementations described herein.

As shown in FIG. 2, the toggling waveform 202 may include a read pulse (READ) that is associated with a read cycle 214 during a read operation and a write pulse (WRITE) that is associated with a write cycle 214 during a write operation. The toggling waveform 2020 also shows a precharge and discharge operation (PRECH & DISCH) that occurs during a precharge and discharge cycle 218. In some instances, precharging and discharging may occur during the same time in between the read cycle 212 and the write cycle 214. As described herein below, precharge circuitry may be configured to precharge a selected bitline in a selected column with a first precharge signal, and the precharge circuitry may also be configured to precharge unselected bitlines in unselected columns with a second precharge signal that is different than the first precharge signal.

Figure 3:
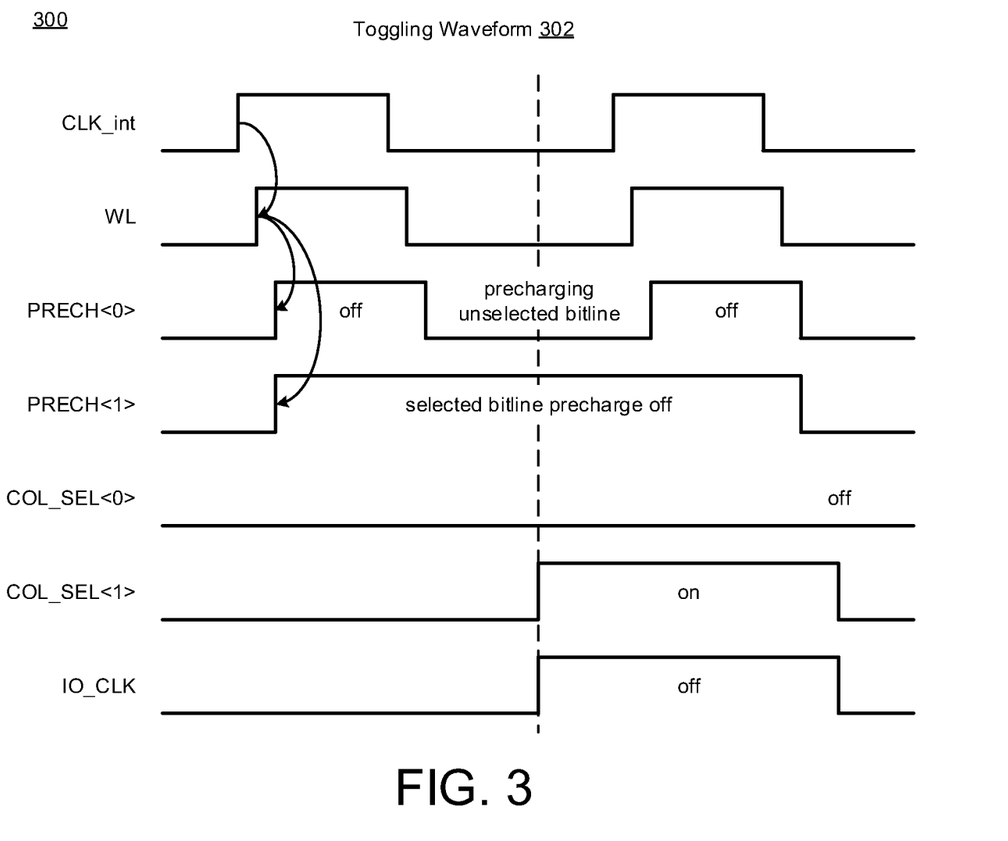
FIG. 3 illustrates a diagram of another toggling waveform in accordance with various implementations described herein.

FIG. 3 illustrates a timing diagram 300 of a toggling waveform 302 related to precharge circuitry in accordance with various implementations described herein.

As shown in FIG. 3, the toggling waveform 302 may include an internal clock signal (CLK_int) that provides a clock pulse to precharge circuitry. The rising edge of the clock pulse (CLK_int) triggers a first wordline pulse signal (WL) on a selected wordline, and in some instances, the first wordline pulse signal (WL) may be configured to trigger precharging and/or discharging of unselected bitlines (PRECH<0>) and selected bitline (PRECH<1>). For instance, as shown in FIG. 3, the PRECH<0> signal may be turned off during a first pulse and a second pulse, and in between these two pulses, precharging of the unselected bitlines may be achieved with deactivated PRECH<0> signal. Also, in some instances, as shown in FIG. 3, the PRECH<1> signal may be turned off during an active pulse cycle, and also, precharging of the selected bitline may be achieved with an active PRECH<1> signal. In some instances, a first column select signal (COL_SEL<0>) for unselected bitlines may be turned off, and also, another second column select signal (COL_SEL<1>) for the selected bitline may be turned on (activated) with an active pulse during precharging of the unselected bitlines. Also, in this instance, an input-output clock signal (IO_CLK) may be turned on (activated) at a same time as the second column select signal (COL_SEL<1>) during precharging of the unselected bitlines.

In some implementations, when the first clock (CLK_int) resets, the global write enable (GWEN) signal toggles. Since GWEN toggling is a clocked signal, the CLK_int signal may be used to generate the write selection signal (YW/WCLK) instead of the GTP signal, which may be used to control the bitline precharge signal. For unselected columns, the precharge is turned ON, and for the selected column, precharge is disabled. Based on the data to be written, either the bitline (BL) or its complementary bitline (NBL) is pulled low. In this instance, the column select signals and/or the data information may be used to precharge the NBL, if the BL is pulled-low or vice-versa. Further aspects, features and behaviors associated with the bitline precharging schemes and techniques along with the circuitry related thereto is described in greater detail herein.

Figure 4:
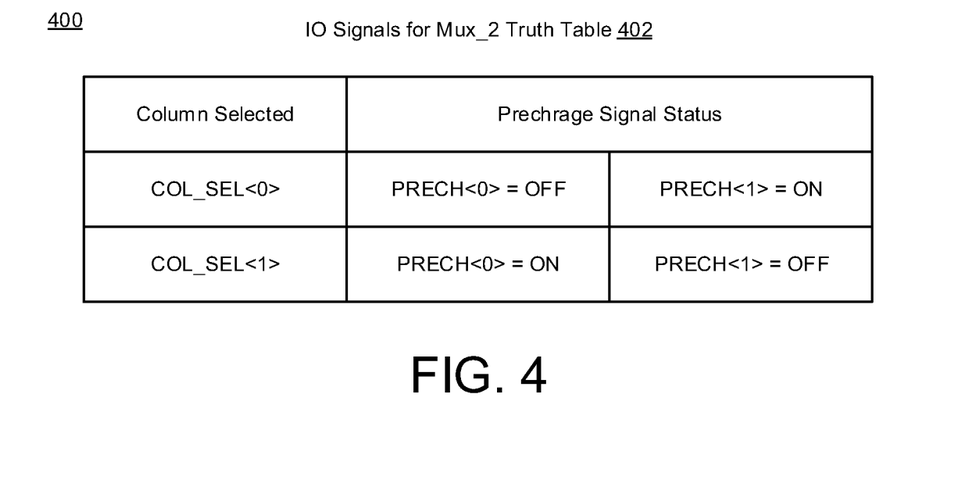
FIG. 4 illustrates a truth table diagram of input-output (IO) signals for a 2-input multiplexer (Mux_2) in accordance with various implementations described herein.

FIG. 4 illustrates a diagram 400 of a truth table 402 for IO signals in reference to a 2-input multiplexer (Mux_2) in accordance with implementations described herein.

As shown in FIG. 4, the truth table 402 may refer to columns selected along with an associated precharge signal status. For instance, during a first timing cycle, a first column selected (COL_SEL<0>) may refer to a precharge signal status of OFF for a first precharge signal (PRECH<0>), and during the same first timing cycle, the second column selected (COL_SEL<1>) may refer to a precharge signal status of ON for a second precharge signal (PRECH<1>). Otherwise, in another instance, during a second timing cycle, the first column selected (COL_SEL<0>) may refer to a precharge signal status of ON for the first precharge signal (PRECH<0>), and during the same second timing cycle, the second column selected (COL_SEL<1>) may have a precharge signal status of OFF for the second precharge signal (PRECH<1>).

Figure 5:
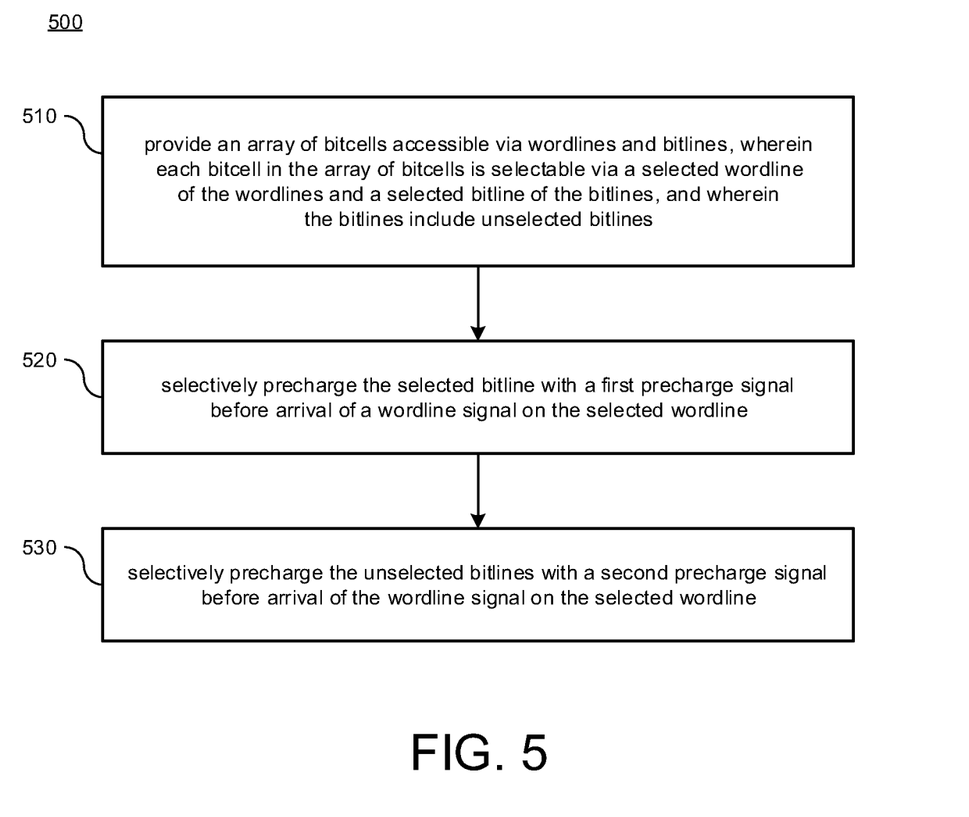
FIG. 5 illustrates a diagram of a method for bitline precharging in accordance with various implementations described herein.

FIG. 5 illustrates a diagram 500 of a method for providing bitline precharging techniques in accordance with various implementations described herein.

It should be understood that even though method 500 indicates a particular order of operation execution, in some cases, various certain portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1-4 and 6A-7C. Also, if implemented in software, method 500 may be implemented as a program and/or software instruction process configured for providing bitline precharging techniques, as described herein. Further, if implemented in software, instructions related to implementing the method 500 may be stored in memory and/or a database. For instance, a computer or various other types of computing devices having a processor and memory may be configured to perform method 500.

In various implementations, method 500 may refer to a method of designing, providing, building and/or manufacturing bitline precharging circuitry as an integrated system, device and/or circuit that may involve use of the various IC circuit components described herein so as to thereby implement bitline precharging schemes and techniques associated therewith. The bitline precharging circuitry may be integrated with computing circuitry and various related components on a single chip, and also, the bitline precharging circuitry may be implemented in various embedded systems for various electronic, mobile and Internet-of-things (IoT) applications, including sensor nodes.

At block 510, method 500 may provide an array of bitcells that are accessible via wordlines and bitlines. In some instances, each bitcell in the array of bitcells may be selectable via a selected wordline of the wordlines and a selected bitline of the bitlines, and the bitlines may include unselected bitlines. In some instances, the array of bitcells may be arranged in columns, wherein the columns may include a selected column having the selected bitline, and wherein the columns may include unselected columns having the unselected bitlines.

At block 520, method 500 may selectively precharge the selected bitline with a first precharge signal before arrival of a wordline signal on the selected wordline. Also, at block 530, method 500 may selectively precharge the unselected bitlines with a second precharge signal (which may be different than the first precharge signal) before arrival of the wordline signal on the selected wordline. In some instances, the selected bitline and the unselected bitlines may be precharged at different times during the same clock cycle before arrival of the wordline signal on the selected wordline. Also, in other instances, the selected bitline may correspond to a write bitline that is discharged while the unselected bitlines are precharged by precharge circuitry.

In some implementations, discharging the selected bitline while precharging the unselected bitlines may improve write time by increasing speed of a write operation to a selected bitcell in the array of bitcells. Also, in some instances, discharging the selected bitline and precharging the unselected bitlines are achieved in parallel during the same clock cycle. Further, the selected bitline may be precharged with a first precharge signal, and also, the unselected bitlines may be precharged with a second precharge signal that is different than the first bitline signal.

In various implementations, schematic diagrams of bitline precharging circuitry shown in FIGS. 6A-6B and 7A-7C provide for some example embodiments of logic that may be used to implement various schemes and techniques described herein. However, there are other ways to realize similar logic, and thus, implementations shown in FIGS. 6A-6B and 7A-7C may be achieved in various other ways and should not be limited to the schematic diagrams shown in these designs of FIGS. 6A-6B and 7A-7C.

Figure 6A:
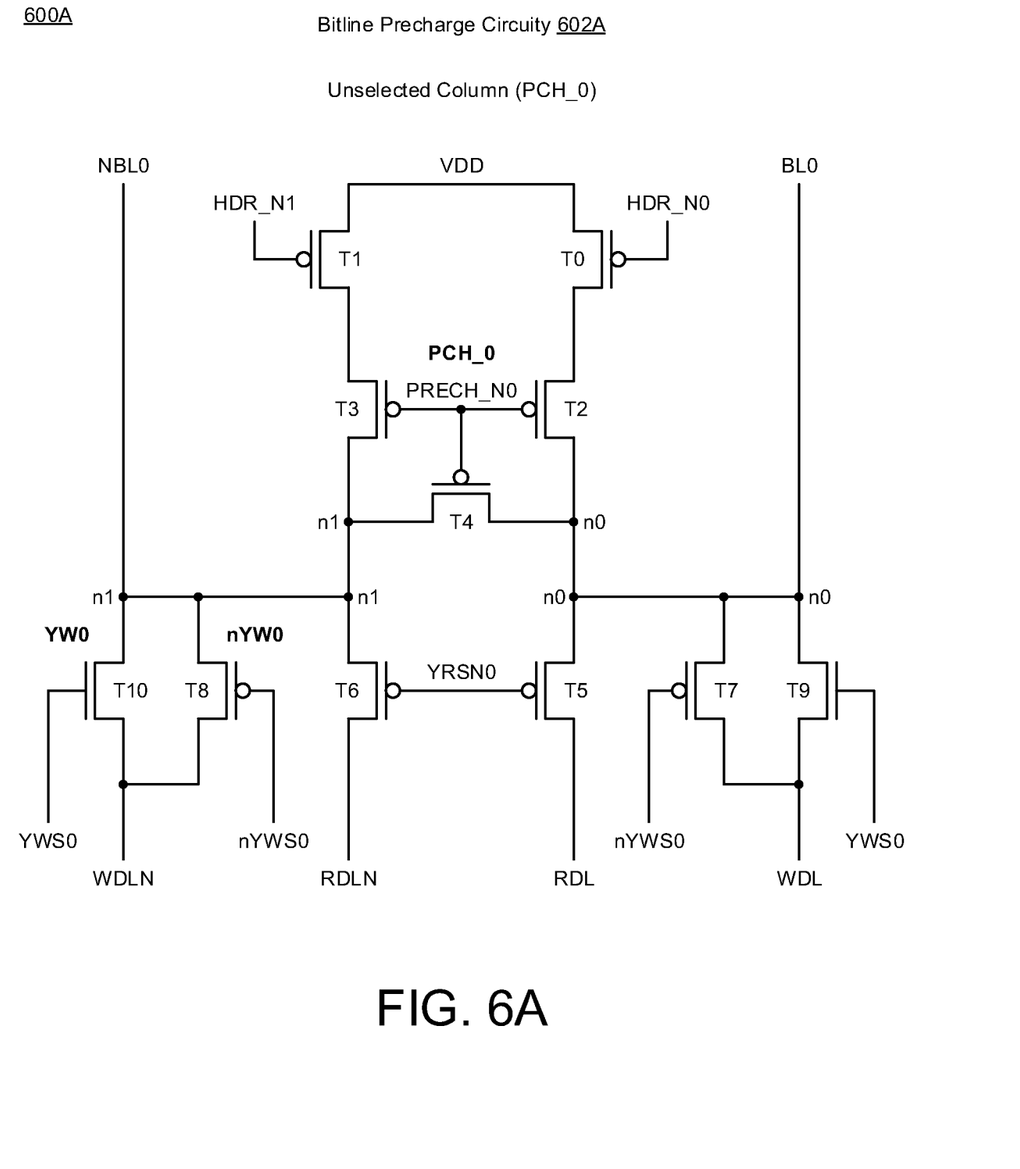
FIGS. 6A-6B illustrate diagrams of bitline precharge circuitry in accordance with various implementations described herein.
Figure 6B:
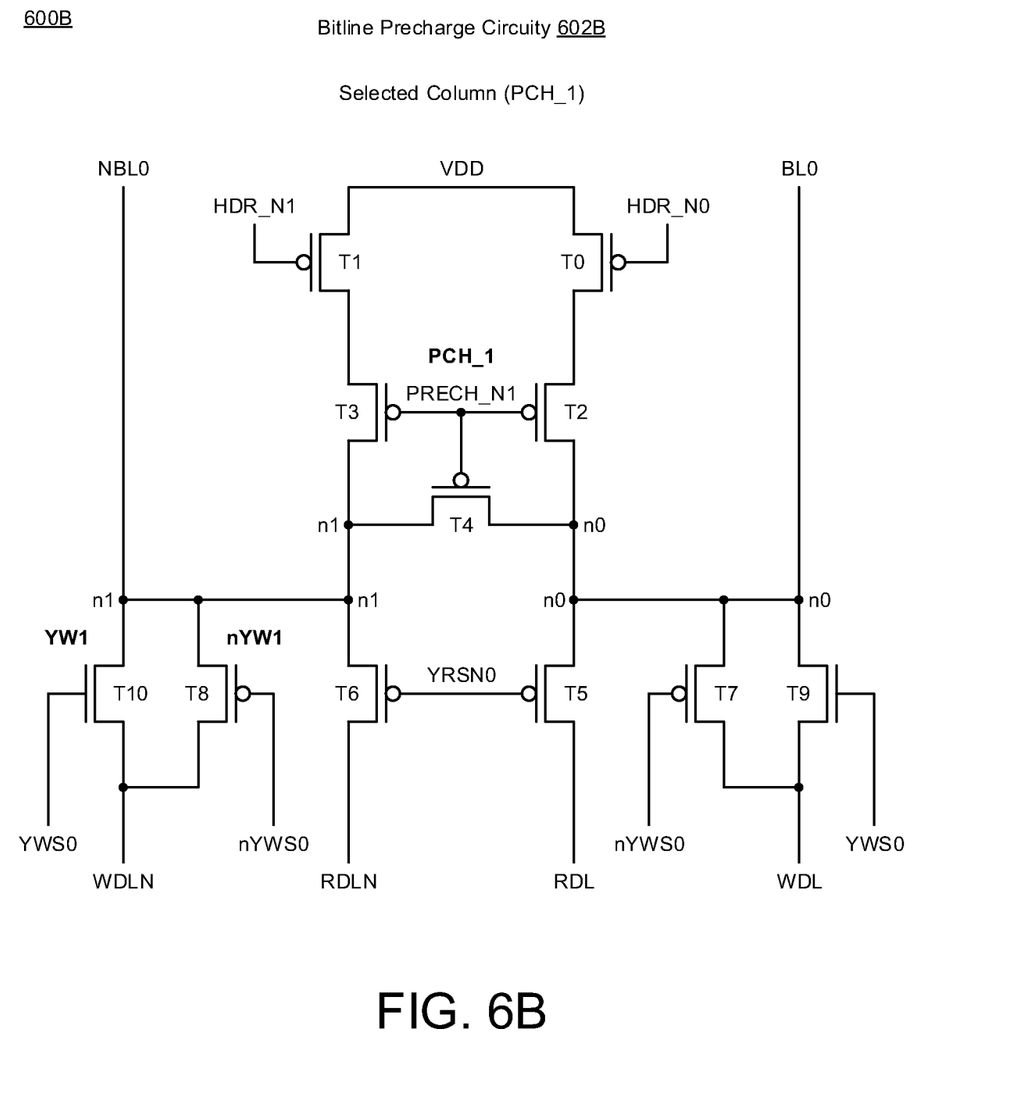

FIGS. 6A-6B illustrate various diagrams of bitline precharge circuitry 602A, 602B in accordance with various implementations described herein. In particular, FIG. 6A illustrates a diagram 600A of bitline precharge circuitry 602A, and FIG. 6B illustrates a diagram 600B of bitline precharge circuitry 602B. In some implementations, the bitline precharge circuitry 602A, 602B may be formed as part of a memory circuit, such as, e.g., the memory circuitry 100 of FIG. 1 having one or more arrays of bitcells. Also, in some instances, the bitline precharge circuitry 602A, 602B of FIGS. 6A-6B may refer to multi-column bitline precharging circuitry for use with one or more bitcell arrays.

In various implementations, the bitline precharge circuitry 602A, 602B may be implemented as a system or device having various integrated circuit (IC) components that are arranged and coupled together as an assemblage or combination of parts that provide for a physical circuit layout design and related structures. In some instances, a method of designing, providing and fabricating the bitline precharge circuitry 602A, 602B as an integrated system or device may involve use of various IC circuit components described herein so as to thereby implement various bitline precharging schemes and techniques associated therewith. The bitline precharge circuitry 602A, 602B may be integrated with computing circuitry and related components on a single chip, and the bitline precharge circuitry 602A, 602B may be implemented in various embedded systems for electronic, mobile and Internet-of-things (IoT) applications, including sensor nodes.

As shown in FIG. 6A, the bitline precharge circuitry 602A may be coupled to bitlines (BL0, NBL0) and also to an array of memory cells (or bitcells) arranged in columns and rows via the bitlines (BL0, NBL0). For instance, the array of memory cells (or bitcells) and the bitlines (BL0, NBL0) may correspond to the bitcell arrays 104A, 104B and bitlines (BL, NBL) in FIG. 1. In reference to FIG. 6A, the bitline precharge circuitry 602A may refer to an unselected column (PCH_0) in a bitcell array, wherein the unselected columns may include unselected memory cells (or bitcells) coupled to unselected bitlines.

In some implementations, as shown in FIG. 6A, the bitline precharge circuitry 602A may include multiple transistors (e.g., T0, T1, T2, T3, T4, T5, T6, T7, T8, T9, T10) that are arranged and configured to precharge one or more bitlines (BL0, NBL0). For instance, transistor (T0) may be coupled between a voltage supply (VDD) and transistor (T2), and transistor (T0) may be activated with a first header signal (HDR_N0). Also, transistor (T1) may be coupled between the voltage supply (VDD) and transistor (T3), and transistor (T1) may be activated with a second header signal (HDR_N1). Transistor (T2) may be coupled between transistor (T0) and transistor (T5), and transistor (T2) may be activated with a first precharge signal (PRECH_N0), which may refer to a first column selection signal for the unselected column (PCH_0). Also, transistor (T3) may be coupled between transistor (T1) and transistor (T6), and transistor (T1) may also be activated with the first precharge signal (PRECH_N0), which may refer to the first column selection signal for the unselected column (PCH_0). Also, in some instances, transistor (T4) may be coupled between output terminals of transistors (T2, T3), and in this instance, transistor (T4) may also be activated with the first precharge signal (PRECH_N0).

Moreover, in some implementations, as shown in FIG. 6A, transistor (T5) may be coupled between transistor (T2) and a read data line (RDL), and transistor (T5) may be activated with a read selection signal (YRSN0). Also, transistor (T6) may be coupled between transistor (T3) and another read data line (RDLN) that is a complement of RDL, and transistor (T6) may be activated with the read selection signal (YRSN0). Transistor (T7) may be coupled in parallel with transistor (T9) between the first bitline (BL0) at node (n0) and a write data line (WDL), wherein the first bitline (BL0) at node (n0) is also coupled to transistors (T2, T4, T5). In this instance, transistor (T7) may be activated with a write selection signal (nYWS0), and also, transistor (T9) may be activated with another write selection signal (YWS0), which is a complement to nYWS0. Also, transistor (T8) may be coupled in parallel with transistor (T10) between the second bitline (NBL0) at node (n1) and another write data line (WDLN), wherein the second bitline (NBL0) at node (n1) is also coupled to transistors (T3, T4, T6), and the write data line WDLN is a complement to WDL. Further, transistor (T8) may be activated with the write selection signal (nYWS0), and also, transistor (T10) may be activated with the write selection signal (YWS0).

In some implementations, in reference to the first column selection signal for the unselected column (PCH_0), when activated, the transistor (T8) may provide a first write signal (nYW0) to the second bitline (NBL0) via node (n1). Otherwise, in some other implementations, when activated, the transistor (T10) may provide a second write signal (YW0) to the second bitline (NBL0) via node (n1). In this instance, the second write signal (YW0) is a complement to the first write signal (nYW0).

As shown in FIG. 6B, the bitline precharge circuitry 602B may be coupled to bitlines (BL0, NBL0) and also to an array of memory cells (or bitcells) arranged in columns and rows via the bitlines (BL0, NBL0). For instance, the array of memory cells (or bitcells) and the bitlines (BL0, NBL0) may correspond to the bitcell arrays 104A, 104B and bitlines (BL, NBL) in FIG. 1. In reference to FIG. 6B, the bitline precharge circuitry 602B may refer to a selected column (PCH_1) in a bitcell array, wherein the selected column may include a selected memory cell (or bitcell) coupled to selected bitline. In this instance, the selected column (PCH_1) may include a selected memory cell (or bitcell) that is selectable via a selected wordline (WL) and a selected bitline (BL0 or NBL0).

In some implementations, as shown in FIG. 6B, the bitline precharge circuitry 602B may include multiple transistors (e.g., T0, T1, T2, T3, T4, T5, T6, T7, T8, T9, T10) that are arranged and configured to precharge one or more bitlines (BL0, NBL0) in a manner as shown in the bitline precharge circuitry 602A of FIG. 6A. However, in some instances, as shown in reference to FIG. 6B, a second column selection signal for the selected column (PCH_1) may be used. In this instance, transistors (T2, T3, T4) may be activated with a second precharge signal (PRECH_N1), which may refer to the second column selection signal for the selected column (PCH_1). Also, in reference to the second column selection signal for the selected column (PCH_1), when activated, the transistor (T8) may provide a third write signal (nYW1) to the second bitline (NBL0) via node (n1). Otherwise, in some other instances, when activated, the transistor (T10) may provide a fourth write signal (YW1) to the second bitline (NBL0) via node (n1). In this instance, the fourth write signal (YW1) is a complement to the third write signal (nYW1).

In some implementations, in reference to FIGS. 6A-6B, the precharge circuitry 602A, 602B may be configured to selectively precharge a selected bitline and unselected bitlines before arrival of a wordline signal on the selected wordline (WL). In reference to FIG. 6A, the precharge circuitry 602A may be configured to precharge the unselected bitlines in unselected columns (PCH_0) with precharge signal (PRECH_N0). In reference to FIG. 6B, the precharge circuitry 602B may be configured to precharge the selected bitline (PCH_1) in the selected column with precharge signal (PRECH_N1). Also, the precharge circuitry 602A, 602B may be configured to selectively precharge the selected bitline and the unselected bitlines at different times during the same clock cycle before arrival of the wordline signal on the selected wordline (WL). The selected bitline may correspond to a write bitline (WBL) that is discharged while the unselected bitlines are precharged by the precharge circuitry 602A, 602B. In some instances, discharging the selected bitline while precharging the unselected bitlines may improve write time, e.g., by increasing speed of the write operation to a selected bitcell in the array of bitcells. Also, discharging the selected bitline and precharging the unselected bitlines may be achieved in parallel during the same clock cycle, and the first precharge signal (PRECH_0) applied to the unselected column (PCH_0) may be different than the second precharge signal (PRECH_1) applied to the selected column (PCH_1).

Figure 7A:
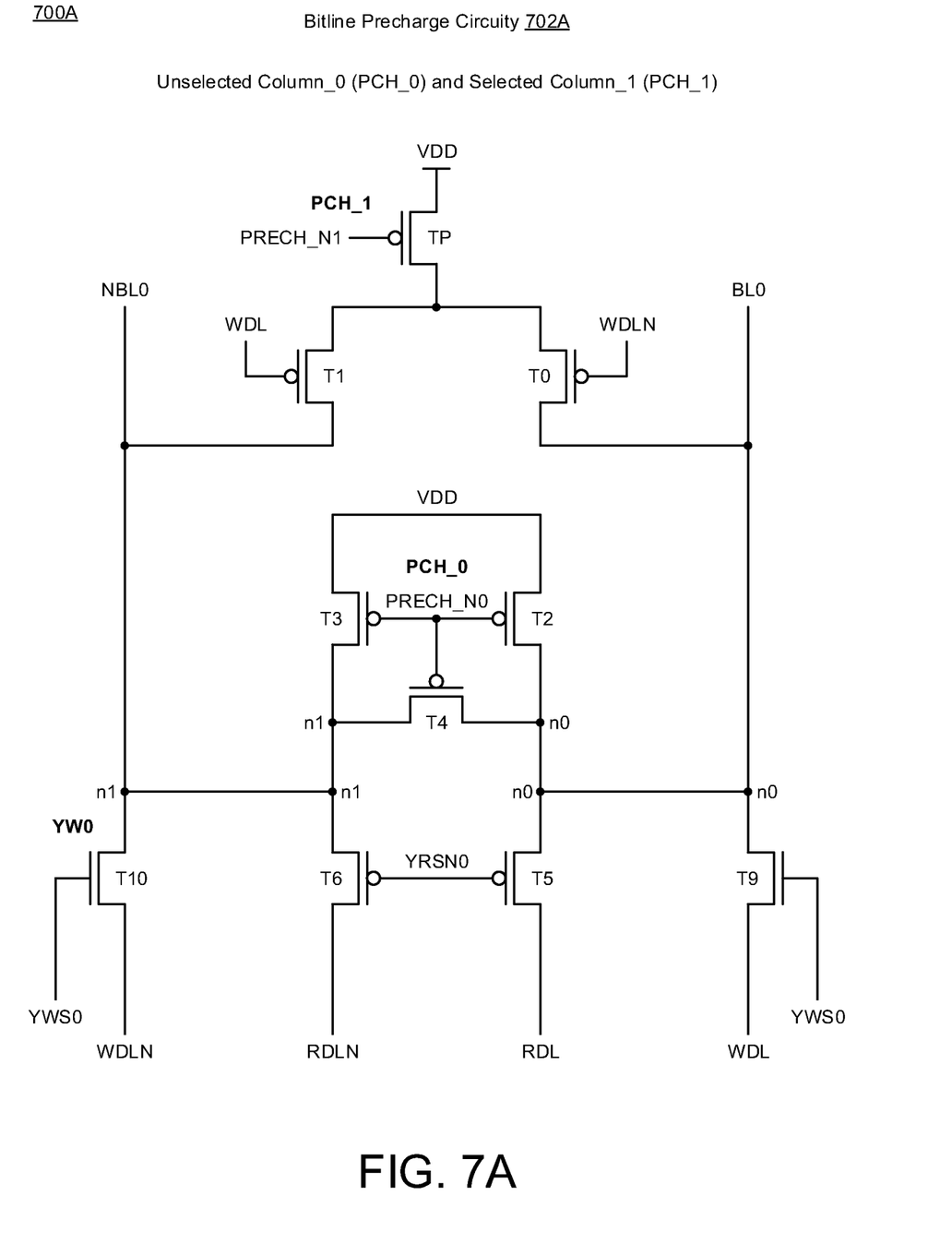
FIGS. 7A-7C illustrate various other diagrams of bitline precharge circuitry in accordance with various implementations described herein.
Figure 7B:
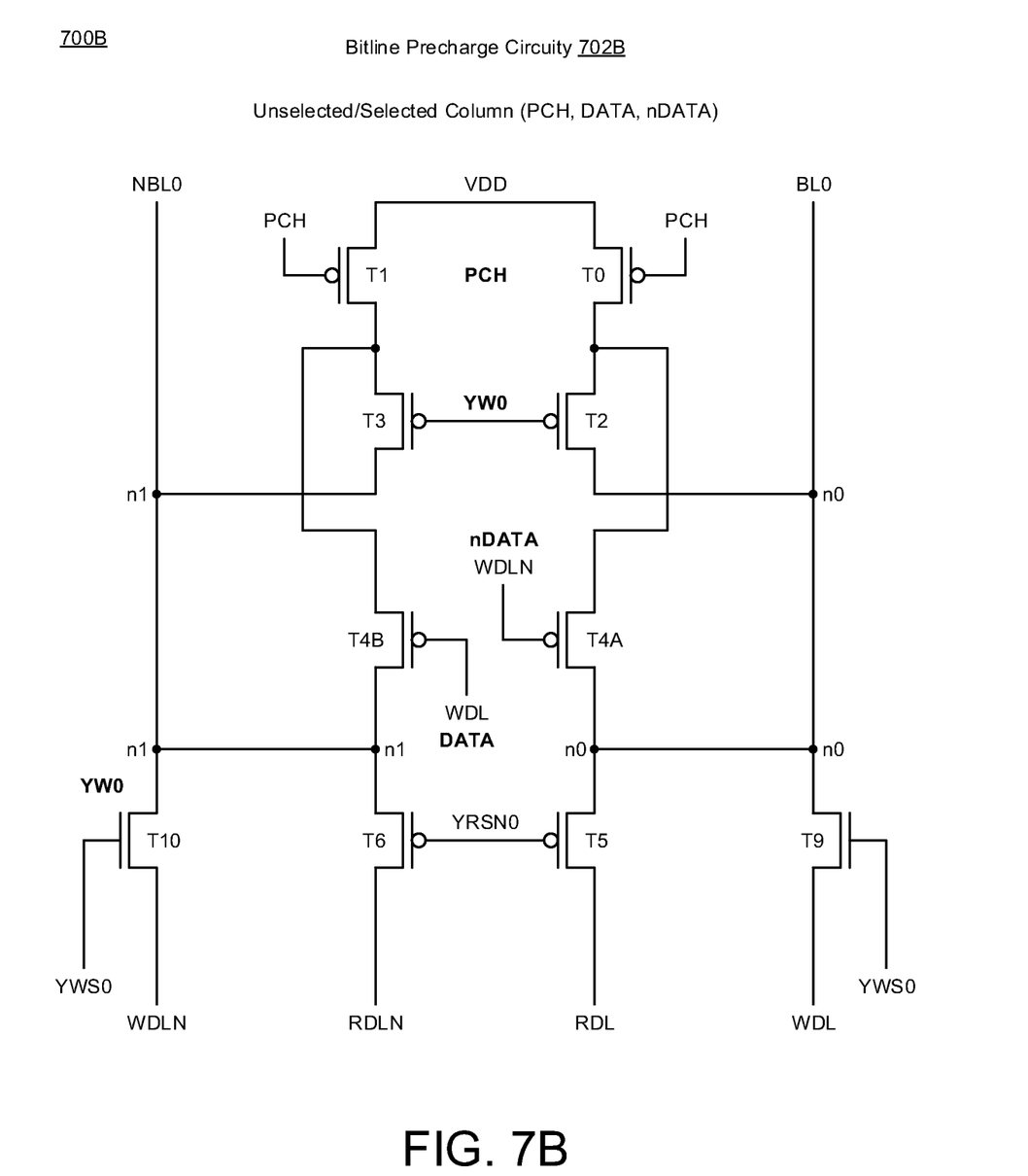
Figure 7C:
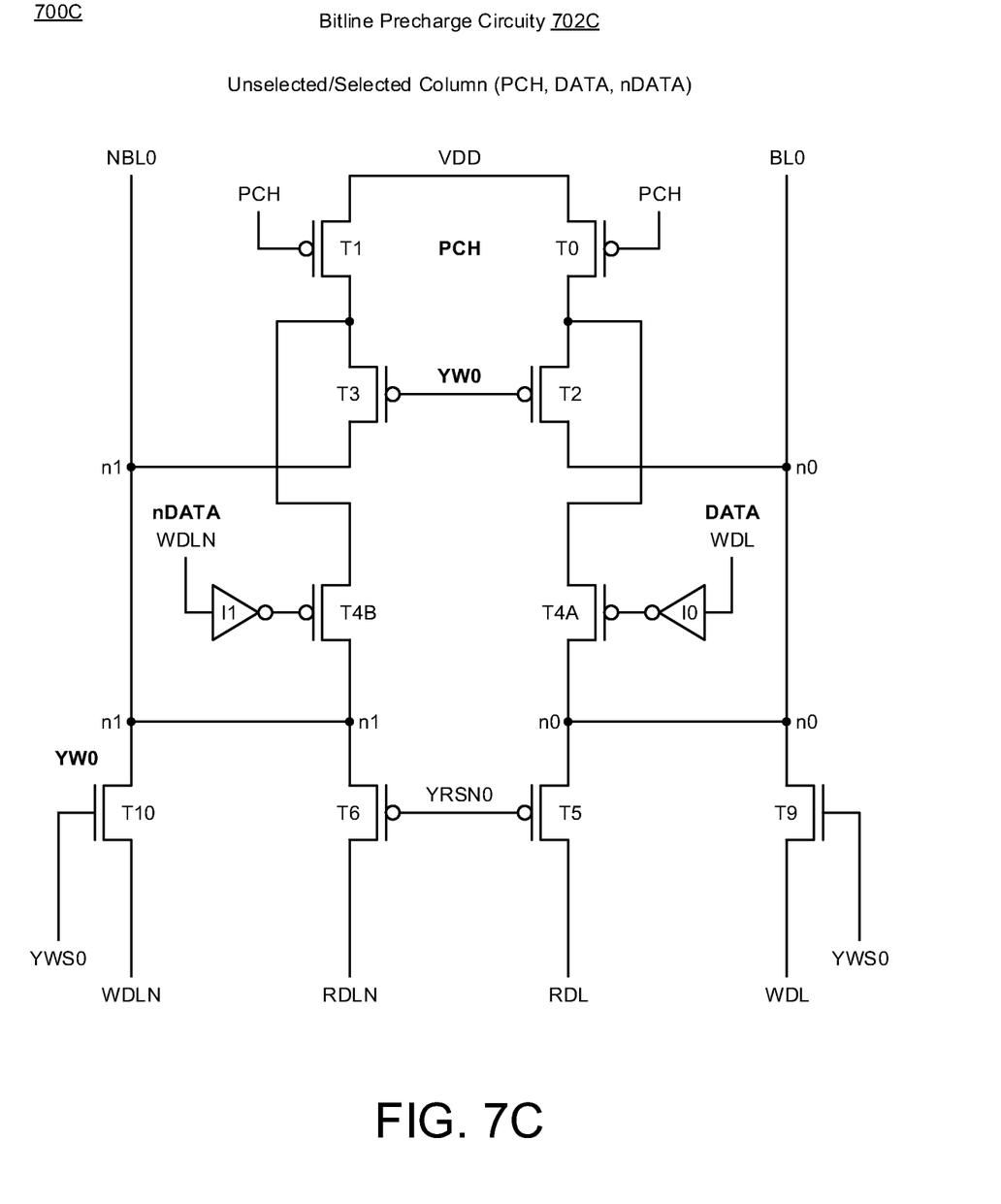

FIGS. 7A-7C illustrate various diagrams of bitline precharge circuitry 702A, 702B, 702C in accordance with various implementations described herein. In particular, FIG. 7A illustrates a diagram 700A of bitline precharge circuitry 702A, FIG. 7B illustrates a diagram 700B of bitline precharge circuitry 702B, and FIG. 7C illustrates a diagram 700C of bitline precharge circuitry 702C.

In some implementations, the bitline precharge circuitry 702A, 702B, 702C may be implemented as a system or device having various integrated circuit (IC) components that are arranged and coupled together as an assemblage or combination of parts that provide for a physical circuit layout design and related structures. In some instances, a method of designing, providing and fabricating the bitline precharge circuitry 702A, 702B, 702C as an integrated system or device may involve use of various IC circuit components described herein so as to thereby implement the various bitline precharging schemes and techniques associated therewith. The bitline precharge circuitry 702A, 702B, 702C may be integrated with computing circuitry and related components on a single chip, and the bitline precharge circuitry 702A, 702B, 702C may be implemented in embedded systems for electronic, mobile and Internet-of-things (IoT) applications.

As shown in FIG. 7A, the bitline precharge circuitry 702A may be coupled to bitlines (BL0, NBL0) and also to an array of memory cells (or bitcells) arranged in columns and rows via the bitlines (BL0, NBL0). For instance, the array of memory cells (or bitcells) and the bitlines (BL0, NBL0) may correspond to the bitcell arrays 104A, 104B and bitlines (BL, NBL) in FIG. 1. In reference to FIG. 7A, the bitline precharge circuitry 702A may refer to an unselected column (PCH_0) or a selected column (PCH_1) in a bitcell array, wherein the selected column may include a selected memory cell (or bitcell) coupled to the selected bitline. In some instances, the unselected column (PCH_0) may include an unselected memory cell (or bitcell). In other instances, the selected column (PCH_1) may include a selected memory cell (or bitcell) that is selectable via a selected wordline (WL) and a selected bitline (BL0 or NBL0).

In some implementations, as shown in FIG. 7A, the bitline precharge circuitry 702A may include transistors (e.g., T0, T1, T2, T3, T4, T5, T6, T9, T10) that are arranged and configured to precharge one or more bitlines (BL0, NBL0) in a manner as shown in the bitline precharge circuitry 702A of FIG. 7A. In various instances, both of the column selection signals (PCH_0, PCH_1) may be used. In this instance, transistor (TP) may be activated with the precharge signal (PRECH_N1), which refers to the column selection signal for the selected column (PCH_1). Also, transistors (T2, T3, T4) may be activated with the precharge signal (PRECH_N0), which refers to the column selection signal for the unselected column (PCH_0). In reference to the column selection signals (PCH_0, PCH_1), when activated, the transistor (T10) may provide the write signal (YW0) to the second bitline (NBL0) via node (n1).

As shown in FIG. 7B, the bitline precharge circuitry 702B may be coupled to bitlines (BL0, NBL0) and also to an array of memory cells (or bitcells) arranged in columns and rows via the bitlines (BL0, NBL0). For instance, the array of memory cells (or bitcells) and the bitlines (BL0, NBL0) may correspond to the bitcell arrays 104A, 104B and bitlines (BL, NBL) in FIG. 1. In reference to FIG. 7B, the bitline precharge circuitry 702B may refer to a column signal (PCH) in a bitcell array, wherein the unselected/selected column may refer an unselected memory cell or a selected memory cell (or bitcell) coupled to the selected bitline. Also, in some instances, the bitline precharge circuitry 702B may utilize data signals (DATA, nDATA) as internal activation signals.

In some implementations, as shown in FIG. 7B, the bitline precharge circuitry 702B may include multiple transistors (e.g., T0, T1, T2, T3, T4A, T4B, T5, T6, T9, T10) that are arranged and configured to precharge one or more bitlines (BL0, NBL0) as shown in the bitline precharge circuitry 702B. In some instances, the column signal (PCH) may be used, and in this instance, transistors (T0, T1) may be activated with the column signal (PCH). Also, transistors (T2, T3) may be activated with the write select signal (YW0), and transistors (T4A, T4B) may be activated with the data signals (nDATA, DATA). In some instances, when activated, the transistor (T10) may provide the write signal (YW0) to the second bitline (NBL0) via node (n1).

As shown in FIG. 7C, the bitline precharge circuitry 702C may be coupled to bitlines (BL0, NBL0) and also to an array of memory cells (or bitcells) arranged in columns and rows via the bitlines (BL0, NBL0). For instance, the array of memory cells (or bitcells) and the bitlines (BL0, NBL0) may correspond to the bitcell arrays 104A, 104B and bitlines (BL, NBL) in FIG. 1. In reference to FIG. 7C, the bitline precharge circuitry 702C may refer to a column signal (PCH) in a bitcell array, wherein the unselected/selected column may refer an unselected memory cell or a selected memory cell (or bitcell) coupled to the selected bitline. Also, in some instances, the bitline precharge circuitry 702C may utilize data signals (DATA, nDATA) as internal activation signals.

In some implementations, as shown in FIG. 7C, the bitline precharge circuitry 702C may include multiple transistors (e.g., T0, T1, T2, T3, T4A, T4B, T5, T6, T9, T10) that are arranged and configured to precharge one or more bitlines (BL0, NBL0) as shown in the bitline precharge circuitry 702C. In some instances, the column signal (PCH) may be used, and in this instance, transistors (T0, T1) may be activated with the column signal (PCH). Also, transistors (T2, T3) may be activated with the write select signal (YW0), and transistors (T4A, T4B) may be activated with the data signals (nDATA, DATA) after being inverted with corresponding inverters (I0, I1). Also, when activated, the transistor (T10) may provide the write signal (YW0) to the second bitline (NBL0) via node (n1).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

Described herein are various implementations of a device. The device may include an array of bitcells that are accessible via wordlines and bitlines including unselected bitlines and a selected bitline. Each bitcell in the array of bitcells may be selectable via a selected wordline of the wordlines and the selected bitline of the bitlines. The device may include precharge circuitry that is configured to selectively precharge the unselected bitlines and the selected bitline before arrival of a wordline signal on the selected wordline.

Described herein are various implementations of a memory circuit. The memory circuit may include an array of memory cells arranged in columns and rows. The columns may include a selected column and unselected columns. The selected column may include a selected memory cell that is selectable via a selected wordline and a selected bitline. The unselected columns may include unselected memory cells coupled to unselected bitlines. The memory circuit may include precharge circuitry that selectively precharges the selected bitline and the unselected bitlines before arrival of a wordline signal on the selected wordline. The precharge circuitry may be configured to precharge the selected bitline in the selected column with a first precharge signal. The precharge circuitry may be configured to precharge the unselected bitlines in the unselected columns with a second precharge signal.

Described herein are various implementations of a method. The method may include providing an array of bitcells accessible via wordlines and bitlines. Each bitcell in the array of bitcells may be selectable via a selected wordline of the wordlines and a selected bitline of the bitlines, and the bitlines may include unselected bitlines. The method may include selectively precharging the selected bitline and the unselected bitlines before arrival of a wordline signal on the selected wordline.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   an array of bitcells that are accessible via wordlines and bitlines including unselected bitlines and a selected bitline, wherein each bitcell in the array of bitcells is selectable via a selected wordline of the wordlines and the selected bitline of the bitlines; and
   precharge circuitry that is configured to selectively precharge the unselected bitlines and the selected bitline at different times before arrival of a wordline signal on the selected wordline.

2. The device of claim 1, wherein the array of bitcells is arranged in columns and rows, and wherein the columns include a selected column having the selected bitline, and wherein the columns include unselected columns having the unselected bitlines.

3. The device of claim 1, wherein the precharge circuitry is configured to selectively precharge the unselected bitlines and the selected bitline at the different times during the same clock cycle before arrival of the wordline signal on the selected wordline.

4. The device of claim 1, wherein the selected bitline corresponds to a write bitline that is discharged while the unselected bitlines are precharged by the precharge circuitry.

5. The device of claim 4, wherein discharging the selected bitline while precharging the unselected bitlines improves write time by increasing speed of a write operation to a selected bitcell in the array of bitcells.

6. The device of claim 4, wherein discharging the selected bitline and precharging the unselected bitlines are achieved in parallel during the same clock cycle.

7. The device of claim 1, wherein the precharge circuitry is configured to precharge the selected bitline with a first precharge signal, and wherein the precharge circuitry is configured to precharge the unselected bitlines with a second precharge signal.

8. A memory circuit, comprising:
   an array of memory cells arranged in columns and rows, wherein the columns include a selected column and unselected columns, wherein the selected column includes a selected memory cell that is selectable via a selected wordline and a selected bitline, and wherein the unselected columns include unselected memory cells coupled to unselected bitlines; and
   precharge circuitry that selectively precharges the selected bitline and the unselected bitlines at different times before arrival of a wordline signal on the selected wordline, wherein:
      the precharge circuitry is configured to precharge the selected bitline in the selected column with a first precharge signal, and
      the precharge circuitry is configured to precharge the unselected bitlines in the unselected columns with a second precharge signal.

9. The circuit of claim 8, wherein the precharge circuitry is configured to selectively precharge the selected bitline and the unselected bitlines at the different times during the same clock cycle before arrival of the wordline signal on the selected wordline.

10. The circuit of claim 8, wherein the selected bitline corresponds to a write bitline that is discharged while the unselected bitlines are precharged by the precharge circuitry.

11. The circuit of claim 10, wherein discharging the selected bitline while precharging the unselected bitlines improves write time by increasing speed of a write operation to a selected memory cell in the array of memory cells.

12. The circuit of claim 10, wherein discharging the selected bitline and precharging the unselected bitlines are achieved in parallel during the same clock cycle.

13. The circuit of claim 8, wherein the first precharge signal applied to the select column is different than the second precharge signal applied to the unselected columns.

14. A method, comprising:
providing an array of bitcells accessible via wordlines and bitlines, wherein each bitcell in the array of bitcells is selectable via a selected wordline of the wordlines and a selected bitline of the bitlines, and wherein the bitlines include unselected bitlines; and
selectively precharging the selected bitline and the unselected bitlines at different times before arrival of a wordline signal on the selected wordline.

15. The method of claim 14, wherein the array of bitcells is arranged in columns, and wherein the columns include a selected column having the selected bitline, and wherein the columns include unselected columns having the unselected bitlines.

16. The method of claim 14, wherein the selected bitline and the unselected bitlines are precharged at the different times during the same clock cycle before arrival of the wordline signal on the selected wordline.

17. The method of claim 14, wherein the selected bitline corresponds to a write bitline that is discharged while the unselected bitlines are precharged.

18. The method of claim 17, wherein discharging the selected bitline while precharging the unselected bitlines improves write time by increasing speed of a write operation to a selected bitcell in the array of bitcells.

19. The method of claim 17, wherein discharging the selected bitline and precharging the unselected bitlines are achieved in parallel during the same clock cycle.

20. The method of claim 14, wherein the selected bitline is precharged with a first precharge signal, and wherein the unselected bitlines are precharged with a second precharge signal that is different than the first bitline signal.

* * * * *